US012074091B2

(12) United States Patent
Koyama et al.

(10) Patent No.: US 12,074,091 B2
(45) Date of Patent: Aug. 27, 2024

(54) SEMICONDUCTOR DEVICE WITH COOLER INCLUDING HEAT DISSIPATING SUBSTRATE HAVING A PLURALITY OF FINS BONDED TO REINFORCING PLATE

(71) Applicant: FUJI ELECTRIC CO., LTD., Kawasaki (JP)

(72) Inventors: Takahiro Koyama, Kawasaki (JP); Hiromichi Gohara, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 409 days.

(21) Appl. No.: 17/538,829

(22) Filed: Nov. 30, 2021

(65) Prior Publication Data

US 2022/0084905 A1 Mar. 17, 2022

Related U.S. Application Data

(63) Continuation of application No. PCT/JP2020/040615, filed on Oct. 29, 2020.

(30) Foreign Application Priority Data

Dec. 19, 2019 (JP) ................. 2019-229215

(51) Int. Cl.
*H01L 23/473* (2006.01)
*H01L 25/07* (2006.01)
(52) U.S. Cl.
CPC .......... *H01L 23/473* (2013.01); *H01L 25/072* (2013.01)
(58) Field of Classification Search
CPC ... H01L 23/473; H01L 23/3677; H01L 23/46; H01L 23/467; H01L 25/072

USPC .......................................... 257/714
See application file for complete search history.

(56) References Cited

U.S. PATENT DOCUMENTS

2018/0204784 A1 7/2018 Kawase et al.
2019/0295924 A1 9/2019 Kawase et al.

FOREIGN PATENT DOCUMENTS

| JP | 2003-249611 A | 9/2003 |
| JP | 2007-110025 A | 4/2007 |
| JP | 2010-010505 A | 1/2010 |
| JP | 2010010505 A * | 1/2010 |

(Continued)

OTHER PUBLICATIONS

International Search Report for PCT/JP2020/040615, mailed on Feb. 9, 2021.

*Primary Examiner* — Matthew E. Gordon
(74) *Attorney, Agent, or Firm* — Rabin & Berdo, P.C.

(57) ABSTRACT

A semiconductor device includes an insulating substrate, semiconductor elements mounted on the insulating substrate, and a cooler for cooling the semiconductor elements. The cooler includes a heat dissipating substrate having bonding and heat dissipating surfaces opposite to each other, the bonding surface being bonded to the second surface of the insulating substrate, a plurality of fins on the heat dissipating surface, a reinforcing plate having first and second surfaces opposite to each other and covering the fins, the first surface being bonded to tips of the fins, and a cooling case including a recessed part to house the fins and reinforcing plate. A first gap between two adjacent fins, measured in a direction parallel to the heat dissipating substrate, is larger than a second gap between the reinforcing plate and a bottom of the first recessed part, measured in a thickness direction.

7 Claims, 10 Drawing Sheets

(56) References Cited

FOREIGN PATENT DOCUMENTS

| JP | 2013-165120 A | | 8/2013 | | |
|---|---|---|---|---|---|
| JP | 2014-045134 A | | 3/2014 | | |
| JP | 2014045134 A | * | 3/2014 | | |
| JP | 2016-092209 A | | 5/2016 | | |
| JP | 2016-136574 A | | 7/2016 | | |
| JP | 2019-160832 A | | 9/2019 | | |
| JP | 2019160832 A | * | 9/2019 | | |
| JP | 2020-027901 A | | 2/2020 | | |
| JP | 2020027901 A | * | 2/2020 | | |
| WO | 2014/045758 A1 | | 3/2014 | | |
| WO | WO-2014045758 A1 | * | 3/2014 | ………… | H01L 23/473 |
| WO | 2017/090106 A1 | | 6/2017 | | |
| WO | 2018/073965 A1 | | 4/2018 | | |

\* cited by examiner

SEMICONDUCTOR DEVICE WITH COOLER INCLUDING HEAT DISSIPATING SUBSTRATE HAVING A PLURALITY OF FINS BONDED TO REINFORCING PLATE

CROSS REFERENCE TO RELATED APPLICATIONS

This is a continuation application of International Application PCT/JP2020/040615 filed on Oct. 29, 2020 which claims priority from a Japanese Patent Application No. 2019-229215 filed on Dec. 19, 2019, the contents of which are incorporated herein by reference.

BACKGROUND OF THE INVENTION

Technical Field

The present invention relates to a semiconductor device including a cooler for cooling semiconductor elements.

Background Art

In hybrid automobiles and electric automobiles, a power conversion device is used to variably drive a motor. In the power conversion device, a semiconductor module (power semiconductor module) including a plurality of power semiconductor elements is used. Typically, power semiconductor elements generate heat when controlling large currents, and the amount of generated heat is increasing as power conversion devices become more compact and produce higher output.

Conventionally, a semiconductor device including a coolant-type cooler has been proposed to cool a power semiconductor module. For example, such a coolant-type cooler includes a metal heat dissipating substrate bonded to the surface on the opposite side of a semiconductor module on an insulating substrate on which power semiconductor elements are mounted, heat dissipating fins formed integrally with the heat dissipating substrate, and a box-shaped cooling case that houses the fins and is attached liquid tight to the heat dissipating substrate. By causing a cooling medium pressurized by an external pump to flow through a channel in the cooling case, the thermal energy of the power semiconductor elements is dissipated to the cooling medium through the fins.

As a specific example of a semiconductor device of this type, for example, Patent Literature 1 discloses a device in which power semiconductor elements are fastened to one side of a cooling fin base, and a plurality of fins are formed on the other side of the cooling fin base. In Patent Literature 1, a box-shaped cooling container is disposed to cover the plurality of fins on the other side of the cooling fin base. A space that acts as a coolant channel is formed by the interior side of the cooling container, the other side of the cooling fin base, and the gaps between plurality of fins.

CITATION LIST

Patent Literature

Patent Literature 1: Japanese Patent Laid-Open No. 2016-092209

SUMMARY OF INVENTION

Meanwhile, in a coolant channel like the above, it is preferable for the coolant to flow through the gaps between the plurality of fins in view of heat exchange. However, the gaps between the fins tend to have high pressure loss. Consequently, the coolant tends to flow preferentially through the clearance between the tips of the fins and the floor of the cooling container where the pressure loss is lower than the gaps between the fins. As a result, the flow rate of coolant cannot be ensured adequately all the way to the base of the plurality of fins, and an uneven cooling effect of the module may occur.

Also, the cooling fin base on which the plurality of fins are formed may undergo thermal deformation during the manufacturing process. In consideration of the thermal deformation, a clearance as described above is provided between the tips of the fins and the floor of the cooling container. To moderate thermal deformation, it is conceivable to increase the thickness of the cooling fin base to ensure rigidity. However, increasing the thickness causes an increase in thermal resistance, and may result in influencing the original thermal conductivity of the cooler.

The present invention has been devised in light of such points, and one objective thereof is to provide a semiconductor device capable of ensuring cooling performance while also ensuring rigidity.

A semiconductor device according to the present embodiment is a semiconductor device including an insulating substrate including a first surface and a second surface on an opposite side of the first surface, semiconductor elements mounted on the first surface of the insulating substrate, and a cooler for cooling the semiconductor elements, the cooler including: a heat dissipating substrate including a bonding surface and a heat dissipating surface on an opposite side of the bonding surface, the bonding surface being bonded to the second surface of the insulating substrate; a plurality of fins provided on the heat dissipating surface of the heat dissipating substrate; a reinforcing plate disposed to cover the plurality of fins and bonded to tips of the plurality of fins; and a cooling case including a recessed part that houses the plurality of fins and the reinforcing plate, wherein a gap between the plurality of fins is larger than a gap between the reinforcing plate and a floor of the recessed part.

According to the present invention, it is possible to ensure cooling performance while also ensuring rigidity.

DESCRIPTION OF EMBODIMENTS

Figure 1:
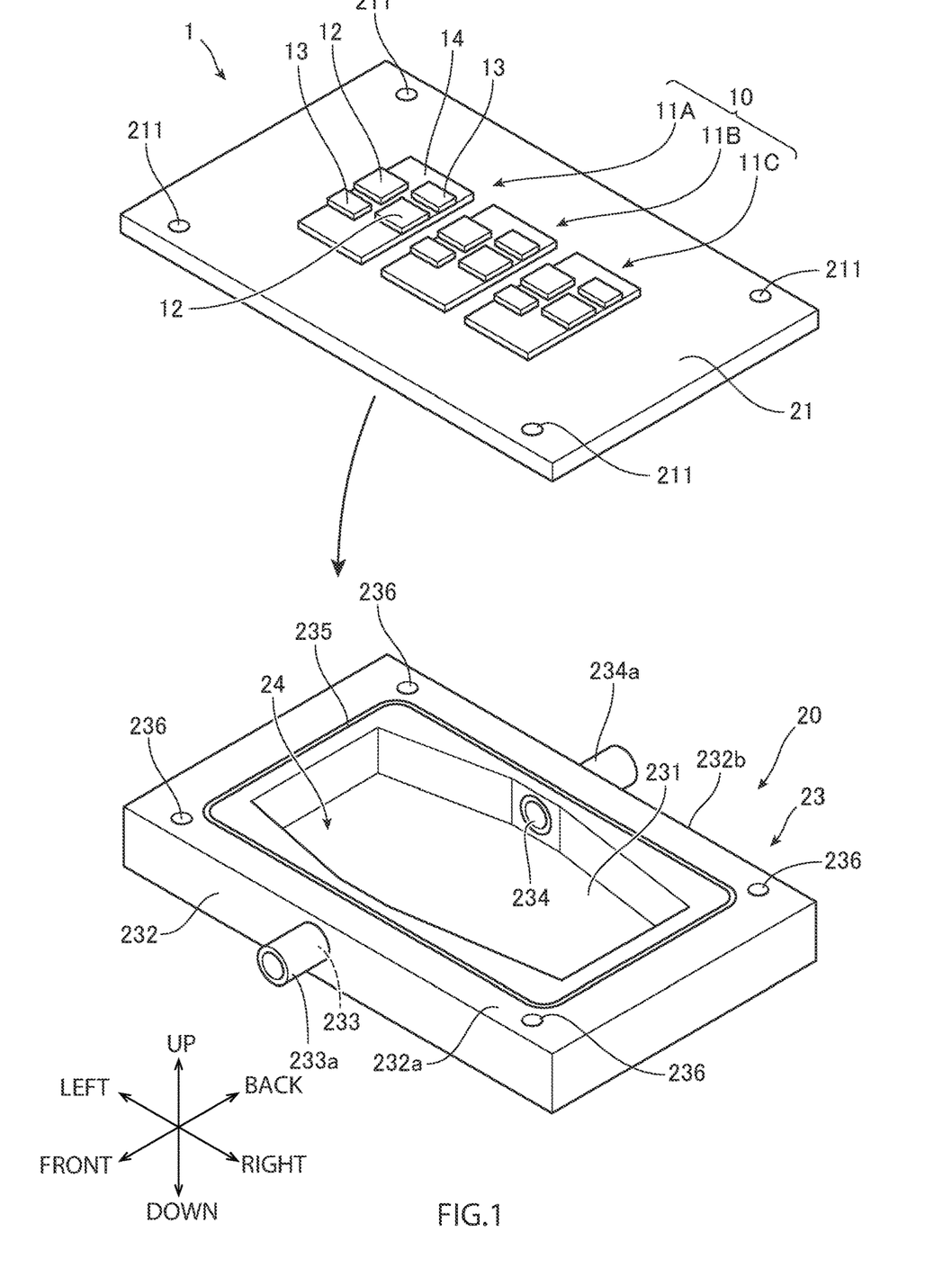
FIG. 1 is an exploded perspective view of a semiconductor device according to an embodiment.
Figure 2A:
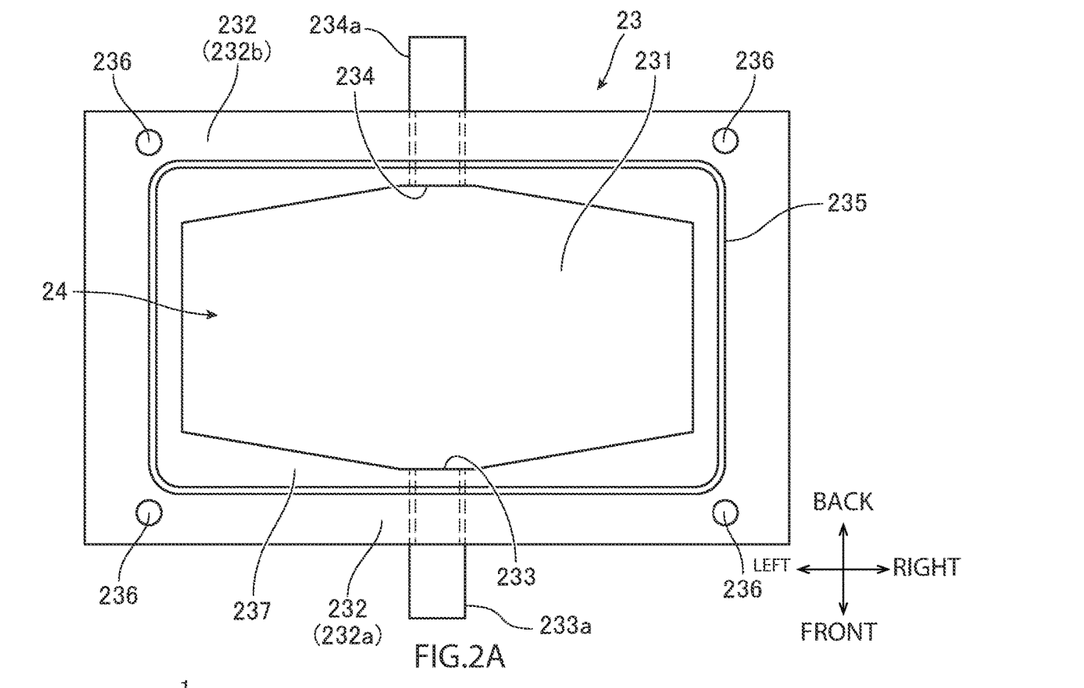
FIGS. 2A and 2B are a plan view of the semiconductor device and a cooling case included in the semiconductor device according to the present embodiment.
Figure 2B:
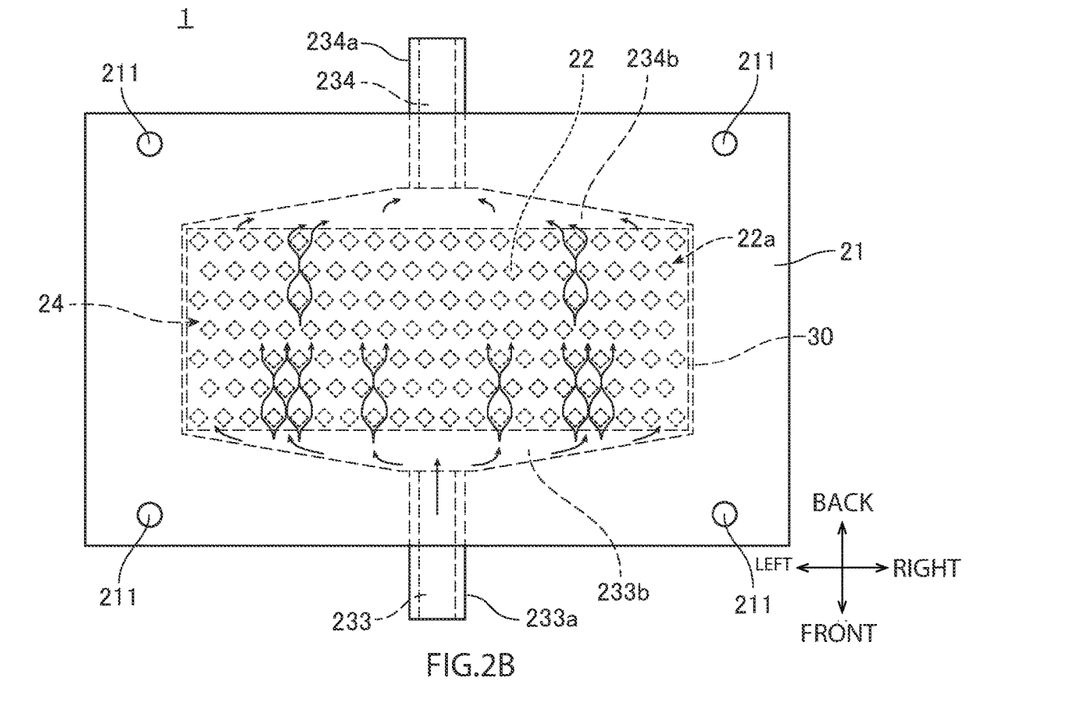

Hereinafter, the configuration of a semiconductor device according to an embodiment will be described with reference to the drawings. FIG. 1 is an exploded perspective view of the semiconductor device according to the present embodiment. FIG. 2 is a plan view of the semiconductor device and a cooling case included in the semiconductor device according to the present embodiment. In the following, for convenience, the vertical direction, the horizontal direction, and the front-back direction illustrated in FIG. 1 will be described as the vertical direction, the horizontal direction, and the front-back direction of the semiconductor device. Also, in the present embodiment, the longitudinal direction of the semiconductor device (the direction in which laminated substrates described later are arranged) is designated the horizontal direction, the transverse direction of the semiconductor device is designated the front-back direction, and the thickness direction of the semiconductor device is designated the vertical direction. These directions (front-back, horizontal, and vertical directions) are terms used for convenience in the description, and depending on the installed attitude of the semiconductor device, the correspondence relationships between these terms and the directions may change. For example, the surface on the heat-dissipating surface side (cooler side) of the semiconductor device is referred to as a bottom surface, while the opposite side is referred to as a top surface. Also, in this specification, a plan view means the case of viewing the top surface of the semiconductor device from above.

As illustrated in FIG. 1, a semiconductor device 1 according to the present embodiment includes a semiconductor module 10 and a cooler 20 that cools the semiconductor module 10. The semiconductor module 10 includes a plurality of circuit element units 11A, 11B, and 11C disposed on a heat dissipating substrate 21 of the cooler 20 described later. With the circuit element units 11A, 11B, and 11C, the semiconductor module 10 forms a three-phase inverter circuit, for example. For example, the circuit element units 11A, 11B, and 11C respectively constitute the W-phase circuit, the V-phase circuit, and the U-phase circuit forming a three-phase inverter circuit.

The circuit element unit 11A constituting the W-phase circuit includes an IGBT element 12 and a freewheeling diode 13 connected antiparallel with the IGBT 12 as semiconductor elements forming an upper arm, and an IGBT element 12 and a freewheeling diode 13 connected antiparallel with the IGBT element 12 to form a lower arm. The IGBT elements 12 and the freewheeling diodes 13 are mounted on an insulating substrate 14 bonded to the heat dissipating substrate 21. Besides an insulated-gate bipolar transistor (IGBT), the semiconductor elements may also be a vertical switching element such as a metal-oxide-semiconductor field-effect transistor (MOSFET) or a reverse-conducting IGBT (RC-IGBT). The semiconductor elements may be formed using a silicon substrate, a silicon carbide substrate, or a gallium nitride substrate.

The circuit element unit 11B constituting the V-phase circuit and the circuit element unit 11C constituting the U-phase circuit also have a configuration similar to the circuit element unit 11A. The insulating substrate 14 includes a first surface and a second surface on the opposite side of the first surface. The semiconductor elements described above are mounted on the first surface of the insulating substrate. The second surface of the insulating substrate 14 is bonded to a top surface (bonding surface) of the heat dissipating substrate 21. A circuit pattern for forming the above circuits is formed on the insulating substrate 14. The insulating substrate 14 is a DCB substrate or an AMB substrate, for example. The insulating substrate 14 may also be a ceramic board, and the circuit pattern may be provided on the ceramic board. The ceramic board may contain aluminum oxide, silicon nitride, or aluminum nitride. The insulating substrate 14 may additionally include a metal plate on the second surface side. The circuit pattern and the metal plate are formed by a metal material such as aluminum or copper. The metal material includes alloys of aluminum or copper. Note that the case where the semiconductor module 10 forms a three-phase inverter circuit is described here. However, the semiconductor module 10 according to the present invention is not limited to the case of forming a three-phase inverter circuit, and appropriate modifications are possible.

The cooler 20 includes the heat dissipating substrate 21, a plurality of fins 22 (see FIG. 3) provided on the heat dissipating substrate 21, and a cooling case 23. As described in detail later, the fins 22 are provided on the surface (heat dissipating surface) of the heat dissipating substrate 21 on the opposite side of the surface (bonding surface) to which the insulating substrate 14 is bonded. Also, a reinforcing plate 30 described later is bonded to the tips of the plurality of fins 22. The heat dissipating substrate 21 is attached to an upper part of the cooling case 23. The plurality of fins 22 and the reinforcing plate 30 provided on the bottom surface (heat dissipating surface) of the heat dissipating substrate 21 are housed in a recessed part 24 (first recessed part) formed in the cooling case 23. Note that the cooling case 23 may also be referred to as a coolant jacket or a water jacket.

The heat dissipating substrate 21 is configured by a metal plate material having a generally rectangular shape. For example, the heat dissipating substrate 21 is configured by a metal material such as aluminum, copper, or iron. The longitudinal direction of the heat dissipating substrate 21 extends in the horizontal direction of the semiconductor device 1, and the transverse direction extends in the front-back direction of the semiconductor device 1. The semiconductor module 10 is disposed in a central region of the top surface of the heat dissipating substrate 21. In the present embodiment, the circuit element units 11A, 11B, and 11C forming the semiconductor module 10 are arranged in the horizontal direction in the central region of the heat dissipating substrate 21. Note that in the present embodiment, the central region on the bottom surface side (heat dissipating surface side) of the heat dissipating substrate 21 on which the circuit element units 11A, 11B, and 11C are disposed as described above may be referred to as a heat dissipation region. Also, screw holes 211 are formed penetrating through the heat dissipating substrate 21 near the four corners of the heat dissipating substrate 21. Screws (not illustrated) that act as fastening members for securing the heat dissipating substrate 21 to the cooling case 23 are inserted into the screw holes 211.

The cooling case 23 has a substantially cuboid outer shape, and is rectangular in a plan view. The outer shape of the cooling case 23 in a plan view is substantially the same as the outer shape of the heat dissipating substrate 21. The cooling case 23 includes a bottom wall 231 and side walls 232 provided on the perimeter of the bottom wall 231, and is shaped like a box that is open on top. In other words, the recessed part 24 is formed on the top surface of the cooling case 23. The recessed part 24 is prescribed by the top surface (floor) of the bottom wall 231 and the inner surfaces of the side walls 232. Although described in detail later, the recessed part 24 is formed large enough to contain the plurality of fins 22 and the reinforcing plate 30.

The cooling case 23 is provided with an inlet port 233 for introducing a cooling medium into the cooling case 23 and an outlet port 234 for discharging the cooling medium from inside the cooling case 23. The inlet port 233 is provided in a first side wall 232a extending in the longitudinal direction from among the side walls 232. The inlet port 233 is formed in the horizontal center of the first side wall 232a such that the outside of the side walls 232 communicates with the recessed part 24 in the front-back direction. The outlet port 234 is provided in a second side wall 232b extending in the longitudinal direction opposite to the first side wall 232a from among the side walls 232. The outlet port 234 is formed in the horizontal center of the second side wall 232b such that the outside of the side walls 232 communicates with the recessed part 24 in the front-back direction. The inlet port 233 and the outlet port 234 are formed by circular holes, for example. A tubular inlet pipe 233a and a tubular outlet pipe 234a are connected to the inlet port 233 and the outlet port 234, respectively. As illustrated in FIG. 2B, the semiconductor device 1 may be configured to form a first header 233b provided on the front side of the plurality of fins 22 and a second header 234b provided on the back side of the plurality of fins 22 in the recessed part 24 of the cooling case 23.

An O-ring 235 is attached to the top surface of the side walls 232. The O-ring 235 is disposed at a position near the recessed part 24 in the side walls 232, so as to surround the recessed part 24. In other words, the O-ring 235 is disposed along a squared annular groove (not illustrated) formed in the top surface of the side walls 232. When the heat dissipating substrate 21 is attached to the cooling case 23 and the cooling medium flows through the cooling case 23, the O-ring 235 fulfills a role of preventing leakage from inside the cooling case 23. Note that the configuration for preventing leakage is not limited to the O-ring 235, and may also be a sealing member such as a metal gasket or a liquid packing.

Screw holes 236 are formed near the four corners of the cooling case 23 (side walls 232). The screw holes 236 are disposed at positions corresponding to the screw holes 211 of the heat dissipating substrate 21 when the heat dissipating substrate 21 is placed on top of the cooling case 23. By inserting and fastening screws (not illustrated) that act as fastening members into the screw holes 236 through the screw holes 211 in the state where the heat dissipating substrate 21 is placed on top of the cooling case 23, the heat dissipating substrate 21 is attached to the cooling case 23.

Figure 3:
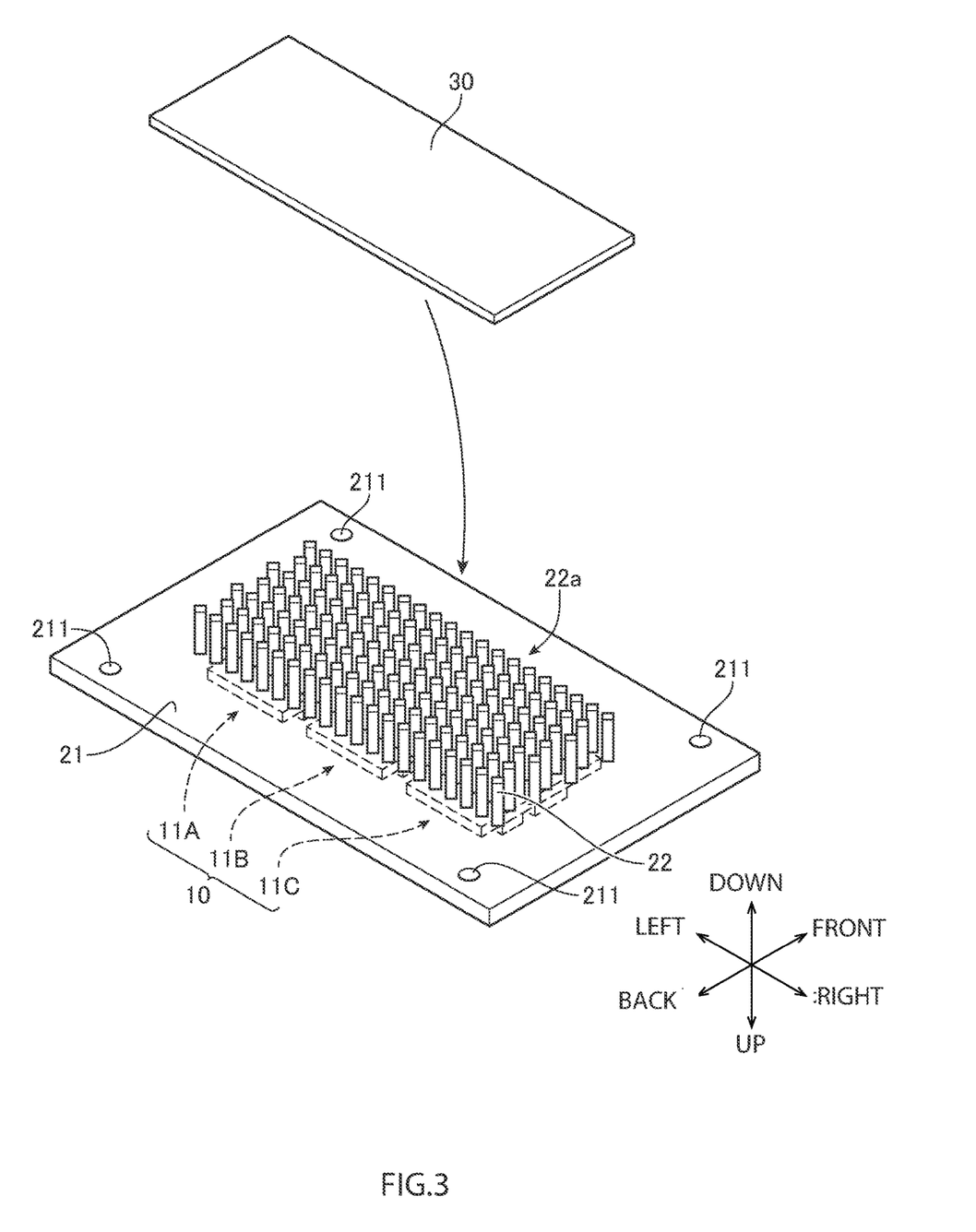
FIG. 3 is a diagram for explaining fins and a reinforcing plate provided on a heat dissipating substrate of the semiconductor device according to the present embodiment.

Here, the configuration of the heat dissipating substrate 21 and the fins 22 provided on the bottom surface of the heat dissipating substrate 21 according to the present embodiment will be described with reference to FIG. 3. FIG. 3 is a diagram for explaining the fins provided on the heat dissipating substrate of the semiconductor device according to the present embodiment.

The fins 22 are provided integrally with the bottom surface of the heat dissipating substrate 21. The fins 22 may be configured by the same metal material as the heat dissipating substrate 21. The fins 22 are used as a heat dissipation plate, or in other words, a heat sink. For example, as illustrated in FIG. 3, pin fins in which a plurality of rectangular columnar pins (square pins) are arrayed at a predetermined pitch with spacing in between can be used as the fins 22. More specifically, the fins 22 are formed to have a diamond shape in a plan view, such that the diagonal direction connecting a pair of opposing corners on a diagonal line is aligned with the transverse direction of the heat dissipating substrate 21 (the direction of coolant flow described later). Note that the configuration of the fins 22 provided on the heat dissipating substrate 21 is not limited to the above, and may be modified appropriately. For example, cylindrical pins may be provided instead of the rectangular columnar pins illustrated in FIG. 3, or a plurality of fins having a blade shape extending the front-back direction may be arranged in parallel with each other. The fins 22 may be provided by being brazed or implanted with respect to the heat dissipating substrate 21, or by a cutting or plastic working process.

Figure 4A:
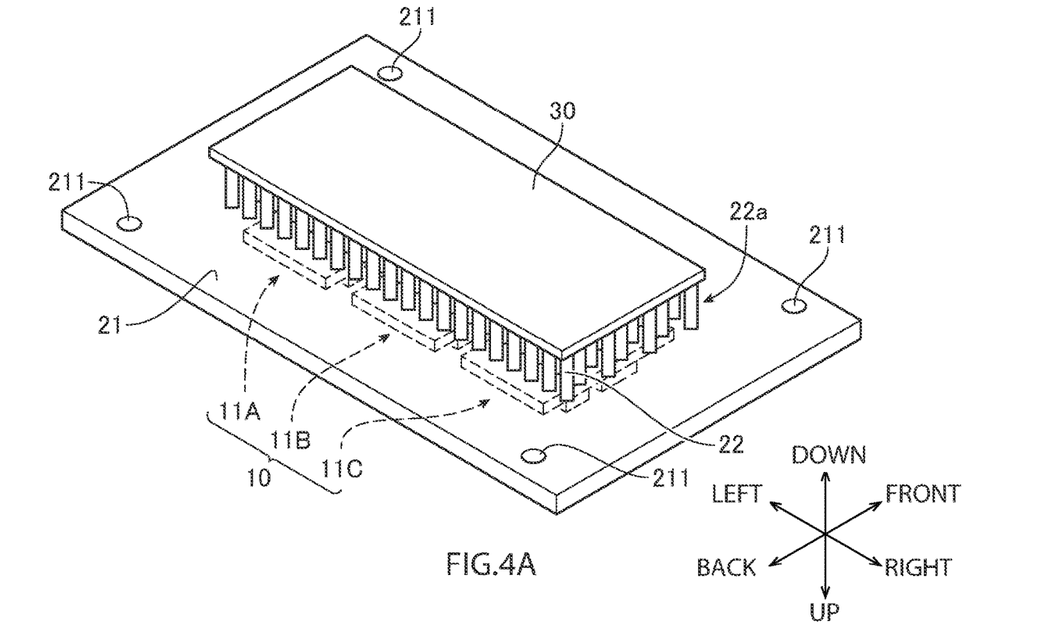
FIGS. 4A and 4B are a perspective view of a cooling base and a cross section illustrating the flow of a cooling medium according to the present embodiment.
Figure 4B:
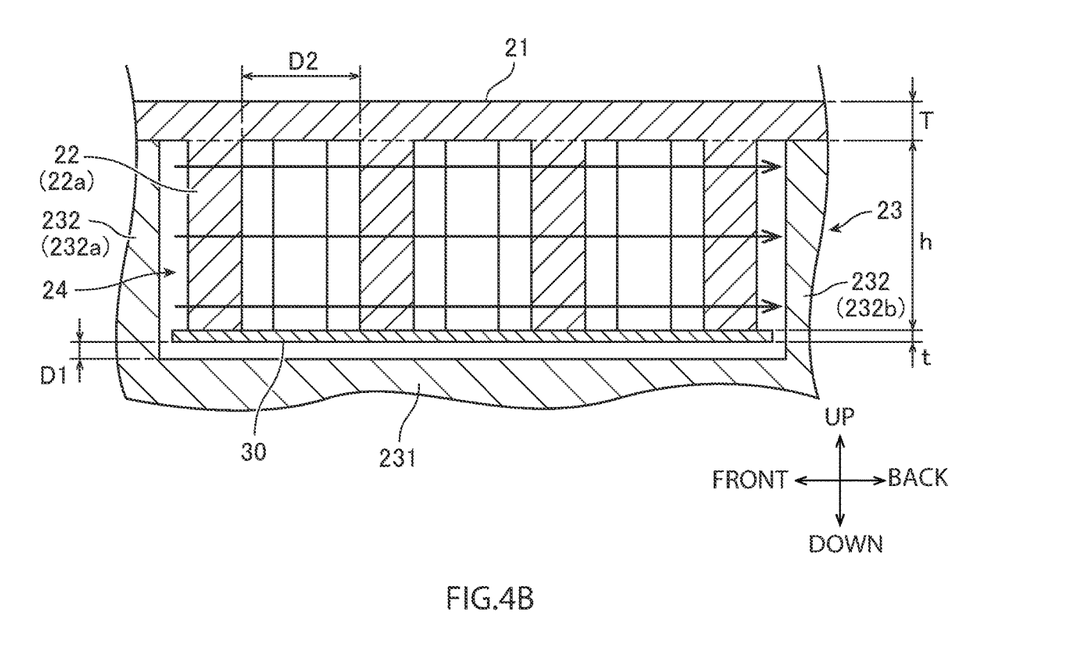

Also, the shape and dimensions of the heat dissipating substrate 21 are preferably set appropriately with consideration for factors such as the conditions of introducing the cooling medium into the cooler 20 (that is, the pump performance and the like), the type and properties of the cooling medium (particularly the viscosity and the like), and the target heat removal rate. Also, the fins 22 are formed having a height such that a certain amount of clearance exists between the tips of the fins 22 and the bottom wall 231 of the cooling case 23 when the fins 22 are housed in the cooling case 23 (more specifically the recessed part 24 of the cooling case 23) (see FIG. 4).

In the heat dissipating substrate 21, the region where the fins 22 are provided preferably includes the region on the opposite side (back surface side) of the mounting region of the semiconductor elements (IGBT elements 12 and freewheeling diodes 13) on the insulating substrate 14 in the state in which the insulating substrate 14 is bonded to the heat dissipating substrate 21. In other words, the region where the fins 22 are provided integrally with the heat dissipating substrate 21 is preferably a region including the region directly underneath the IGBT elements 12 and the freewheeling diodes 13 (the heat dissipation region described above).

In the present embodiment, a group 22a of fins 22 in which the fins 22 having a rectangular columnar shape are plurally arrayed is provided on the bottom surface (heat dissipating surface) of the heat dissipating substrate 21. The outer shape of the group 22a of fins 22 is substantially cuboid. More preferably, the outer shape of the group 22a of fins 22 is cuboid, but is not limited thereto, and may also be a chamfered or deformed shape. The longitudinal direction of the group 22a of fins 22 matches the longitudinal direction of the cooling case 23 (recessed part 24).

Incidentally, a semiconductor device including what is called open-type fins as described above needs a certain degree of rigidity to suppress thermal deformation. The rigidity of the fins described above is ensured by the heat dissipating substrate on which the fins are provided, and it is conceivable to increase the thickness of the heat dissipating substrate itself to impart more strength. However, if the thickness of the heat dissipating substrate 21 itself is increased, the thermal resistance increases, and as a result, the original cooling performance may be impacted. In other words, there is a trade-off between ensuring the rigidity of the heat dissipating substrate and ensuring cooling performance.

Accordingly, the inventors conceived of the present invention in order to ensure both the rigidity of the heat dissipating substrate and the cooling performance. Specifically, in the present embodiment, the reinforcing plate 30 is disposed to cover the plurality of fins 22 on the heat dissipating surface side of the heat dissipating substrate 21, and the reinforcing plate 30 is bonded to the tips of the plurality of fins 22.

Here, FIGS. 3 and 4 will be referenced to described a detailed structure of the semiconductor device including a cooler according to the present embodiment. FIG. 4 is a perspective view of a cooling base (FIG. 4A) and a cross section illustrating the flow of a cooling medium (FIG. 4B) according to the present embodiment.

As illustrated in FIGS. 3 and 4, the reinforcing plate 30 is configured by a metal plate material having a generally rectangular shape. For example, the reinforcing plate 30 is configured by a metal material such as aluminum, copper, or iron. The metal material may also be an alloy mainly composed of aluminum, copper, or iron. Note that the reinforcing plate 30 may be configured by the same metal material as the heat dissipating substrate 21 (fins 22).

The reinforcing plate 30 has a rectangular shape corresponding to the heat dissipation region of the heat dissipating substrate 21, so as to cover the entire plurality of fins 22 (the bottom surface of the group 22a of fins 22). Also, the reinforcing plate 30 is set to be less thick than the heat dissipating substrate 21. Furthermore, the tips of the plurality of fins 22 are bonded to one side of the reinforcing plate 30. The plurality of fins 22 and the reinforcing plate 30 are bonded by brazing, for example. With this arrangement, a heat dissipating substrate 21 in which the plurality of fins 22 and the reinforcing plate 30 are unified is obtained. The reinforcing plate 30 may be rectangular having a long edge and a short edge in a plan view, may be disposed to face the tips of the plurality of fins 22, and may be bonded to the tips of the plurality of fins 22.

The cooling case 23 is attached to the heat dissipating substrate 21 in which the plurality of fins 22 and the reinforcing plate 30 are unified is. The cooling case 23 includes the recessed part 24 corresponding to the heat dissipation region, and is attached such that the plurality of fins 22 and the reinforcing plate 30 are contained inside the recessed part 24. Specifically, the sides of the group 22a of fins 22 are surrounded by the squared annular side walls 232, and the bottom surface of the reinforcing plate 30 faces opposite to the floor (bottom wall 231) of the recessed part 24 to form a predetermined gap (second gap) D1 (see FIG. 4B).

In the semiconductor device 1 according to the present embodiment, the three circuit element units 11A, 11B, and 11C are arranged in the longitudinal direction (horizontal direction) of the heat dissipating substrate 21. Also, the plurality of fins 22 are provided in the heat dissipation region corresponding to the heat dissipating surface of the heat dissipating substrate 21 on which the circuit element units 11A, 11B, and 11C are provided. In addition, the cooling case 23 includes the side walls 232 surrounding the plurality of fins 22. The side walls 232 include the first side wall 232a and the second side wall 232b that oppose each other in the front-back direction (transverse direction) intersecting the predetermined direction (longitudinal direction) in which the three circuit element units 11A, 11B, and 11C are arranged. The first side wall 232a and the second side wall 232b oppose each other in the front-back direction with the group 22a of fins 22 in between. As described above, the coolant inlet port 233 is provided in the first side wall 232a, and the coolant outlet port 234 is provided in the second side wall 232b. The coolant flows in the transverse direction from the inlet port 233, among the plurality of fins 22, and toward the outlet port 234 (see FIGS. 2B and 4B).

More specifically, when the coolant is introduced into the recessed part 24 from the inlet port 233, the coolant flows in the transverse direction into the group 22a through the gaps in the plurality of fins 22 while also colliding into the upstream side of the group 22a of fins 22 and spreading out in the horizontal direction (longitudinal direction of the group 22a) (see FIG. 2B). The coolant is discharged to the outside of the cooling case 23 through the outlet port 234 from the downstream side of the group 22a.

In the present embodiment, by bonding the reinforcing plate 30 to the tips of the plurality of fins 22, the rigidity of the entire heat dissipating substrate 21 including the plurality of fins 22 and the reinforcing plate 30 is increased. This arrangement makes it possible to reduce warping of the heat dissipating substrate 21 in the thickness direction (vertical direction) when the semiconductor module 10 is mounted onto the heat dissipating substrate 21 and heated. Consequently, it is possible to reduce the depth of the recessed part 24 and bring the bottom surface of the reinforcing plate 30 closer to the floor of the recessed part 24 to reduce the gap D1 between the reinforcing plate 30 and the floor of the recessed part 24.

Also, by closing the open space on the tip side of the fins 22 with the reinforcing plate 30, closed coolant channels are formed among the plurality of fins 22. In this case, a gap (first gap) D2 between the plurality of fins 22 is preferably larger than the gap D1 between the reinforcing plate 30 and the floor of the recessed part 24.

According to the above configuration, due to the reinforcing plate 30, the coolant flows less readily through the gap D1 between the reinforcing plate 30 and the floor of the recessed part 24, making it possible to guide more of the coolant among the plurality of fins 22. With this arrangement, heat exchange with the fins 22 is promoted, and the cooling efficiency of the cooler 20 is raised. In other words, it is possible to ensure cooling performance while also ensuring the rigidity of the cooler 20. Furthermore, by increasing rigidity with the reinforcing plate 30, it is also possible to reduce the thickness of the heat dissipating substrate 21 itself and increase the thermal conductivity of the heat dissipating substrate 21. The thickness t of the reinforcing plate 30 may be the same as the thickness T of the heat dissipating substrate 21, or smaller than the thickness T (see FIG. 4B). The height h of the fins 22 may be selected appropriately.

Figure 5A:
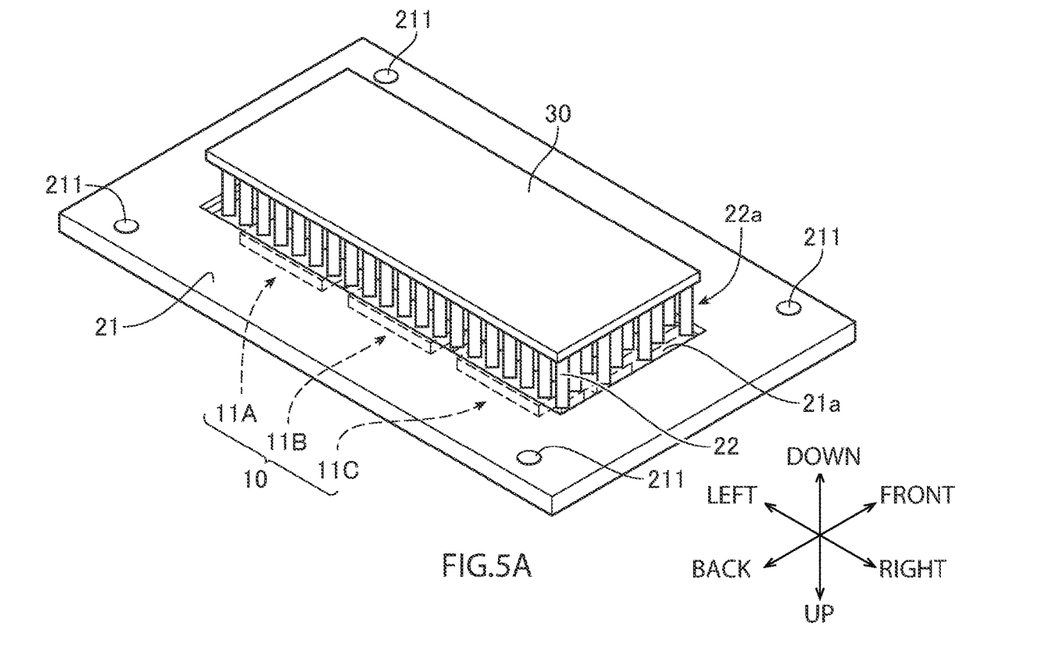
FIGS. 5A and 5B are a perspective view of a cooling base and a cross section illustrating the flow of a cooling medium according to a first modification.
Figure 5B:
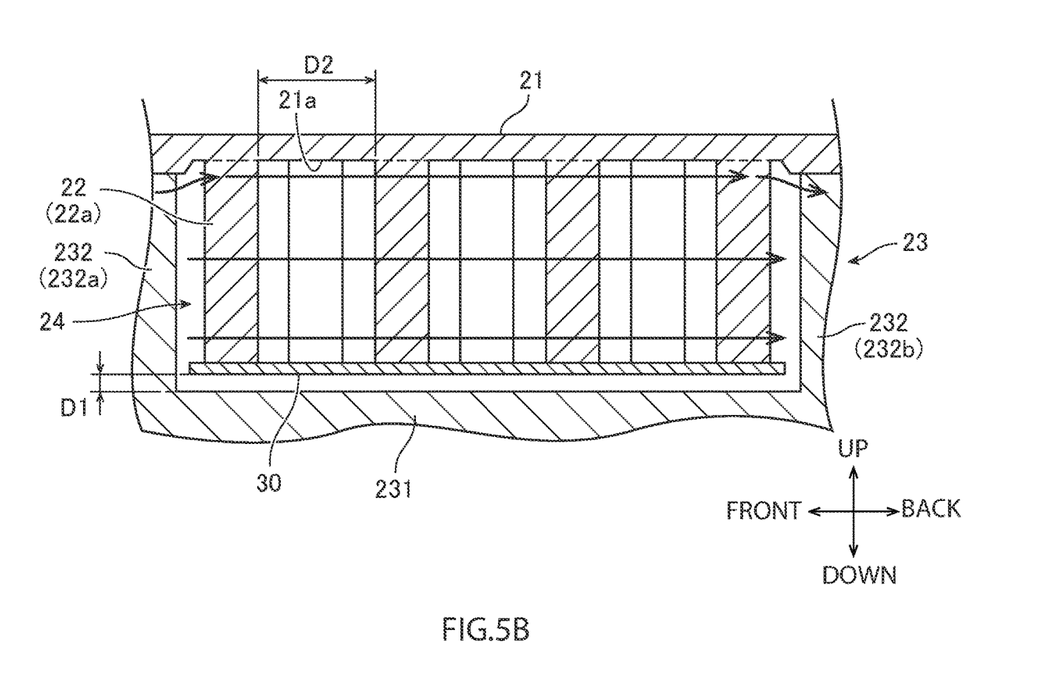
Figure 6A:
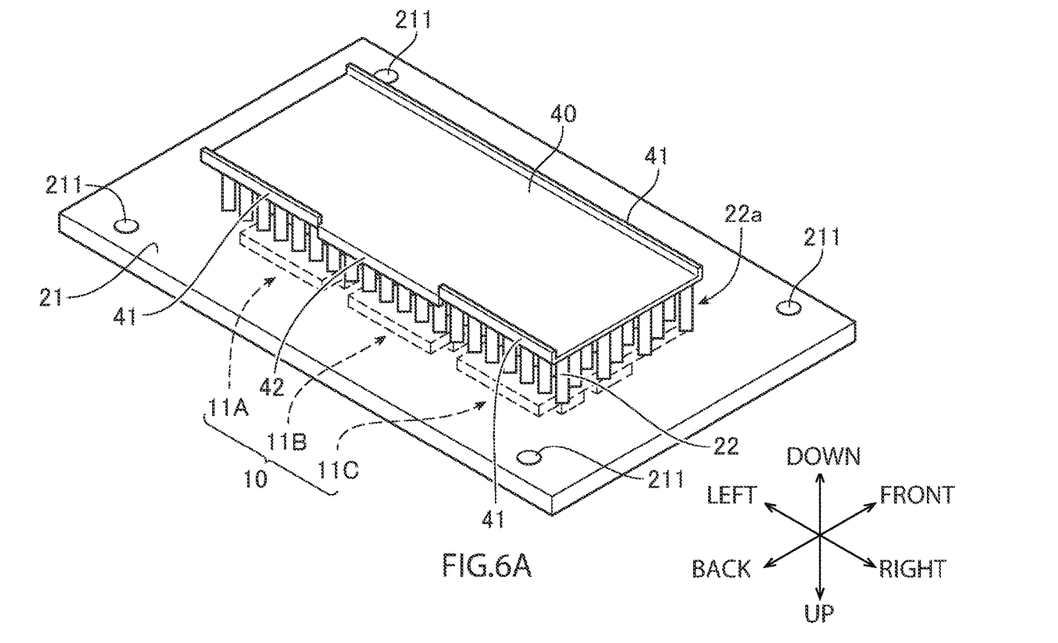
FIGS. 6A and 6B are a perspective view of a reinforcing plate and a cross section illustrating the flow of a cooling medium according to a second modification.
Figure 6B:
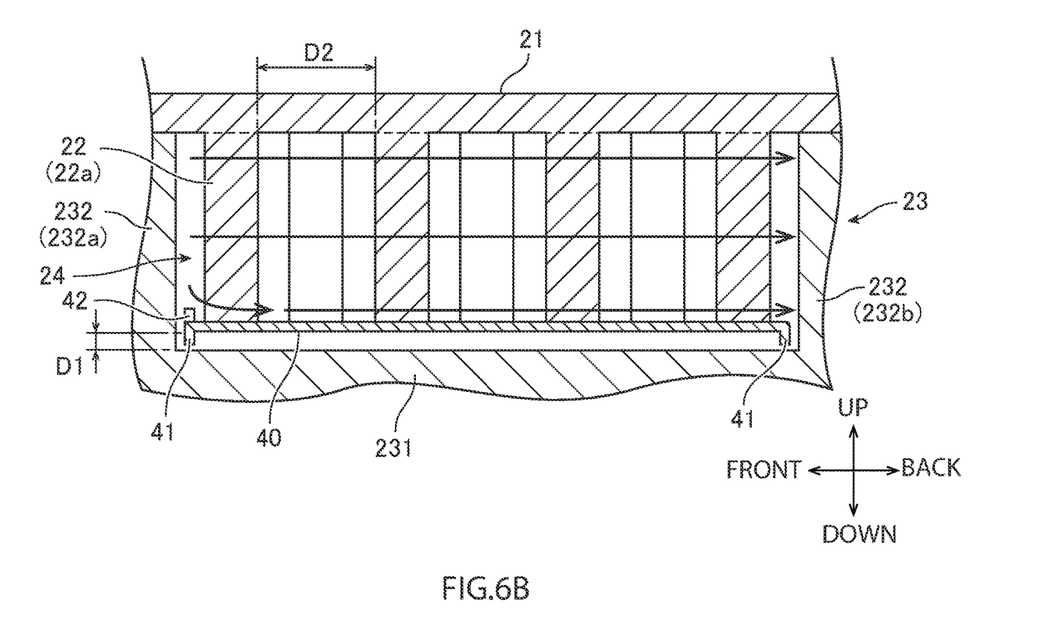
Figure 7A:
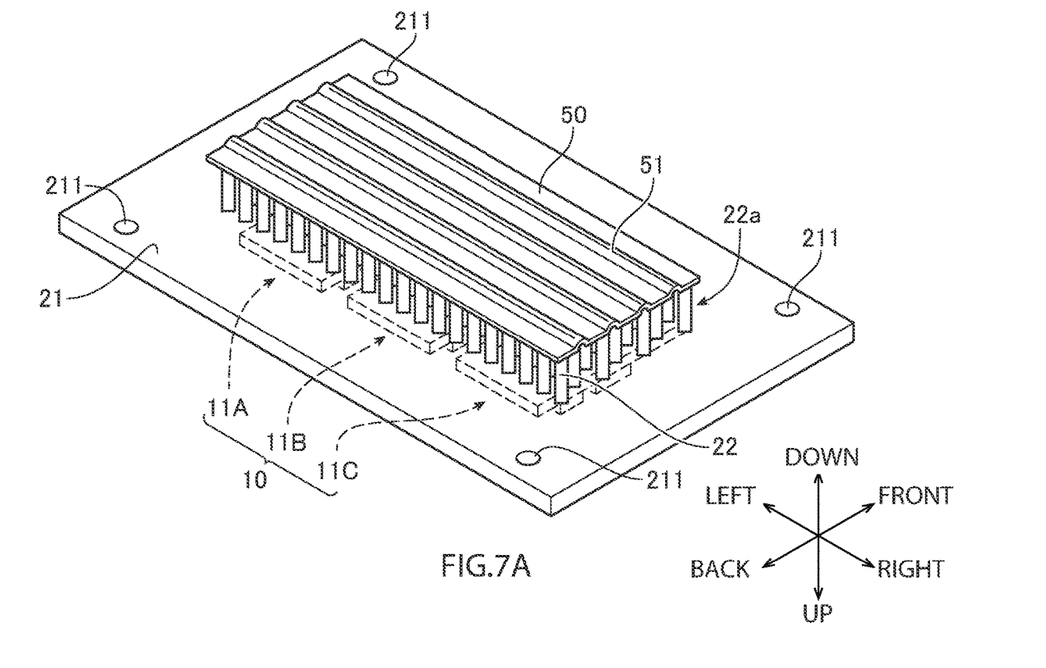
FIGS. 7A and 7B are a perspective view and a cross section of a reinforcing plate according to a third modification.
Figure 7B:
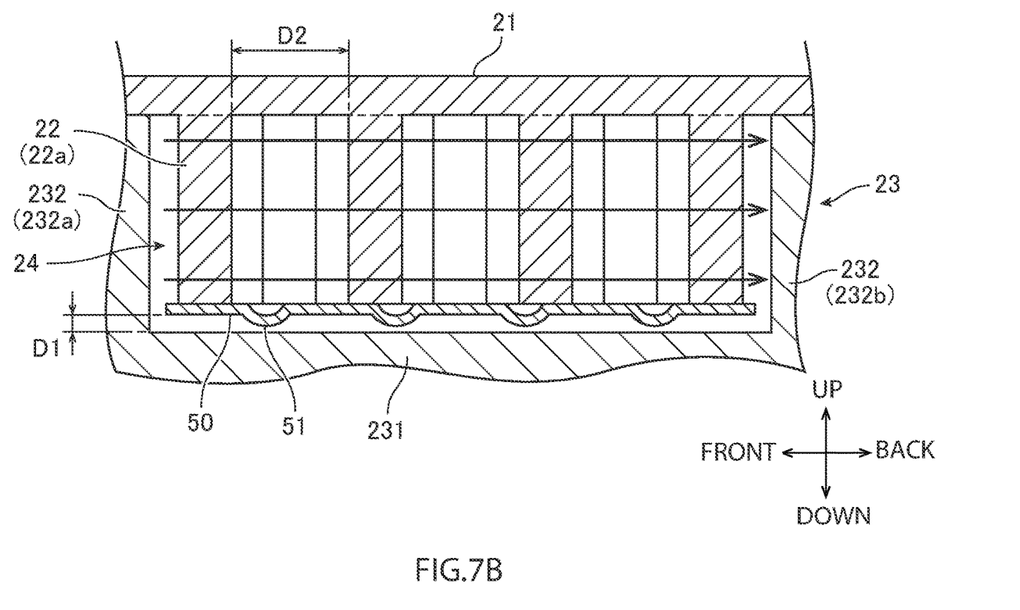
Figure 8:
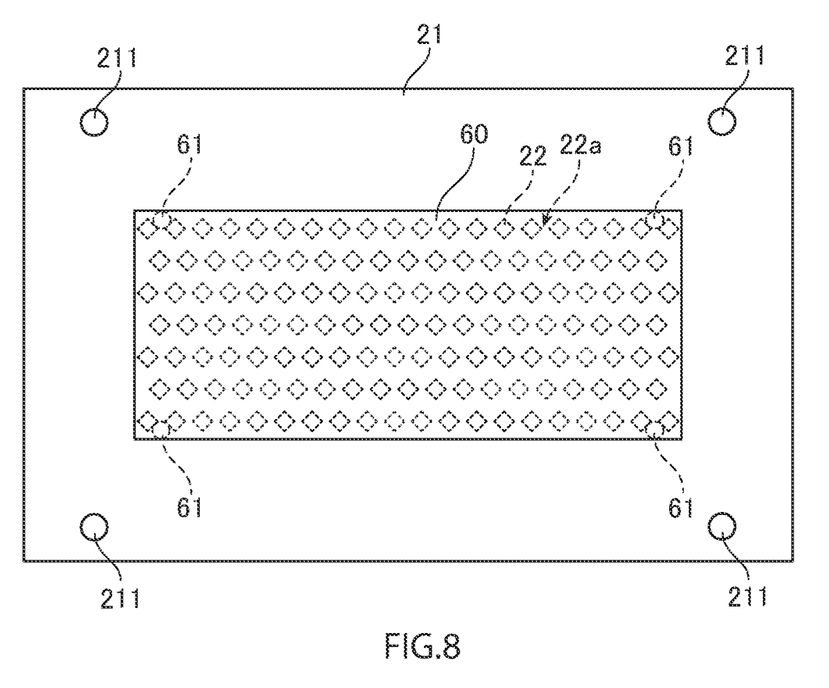
FIG. 8 is a plan view of a reinforcing plate according to a fourth modification.
Figure 9A:
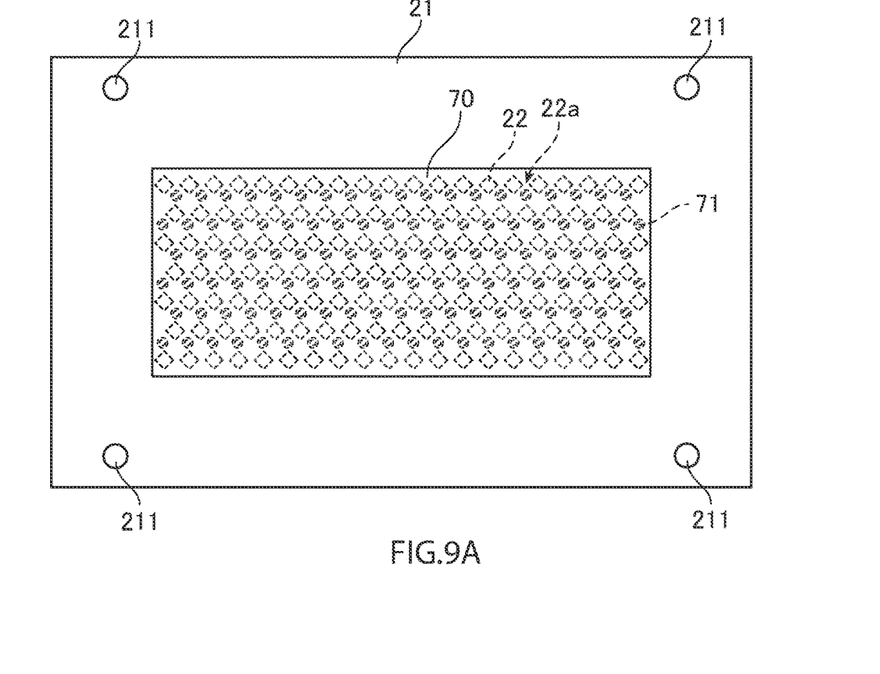
FIGS. 9A and 9B are a plan view of a reinforcing plate and a cross section illustrating the flow of a cooling medium according to a fifth modification.
Figure 9B:
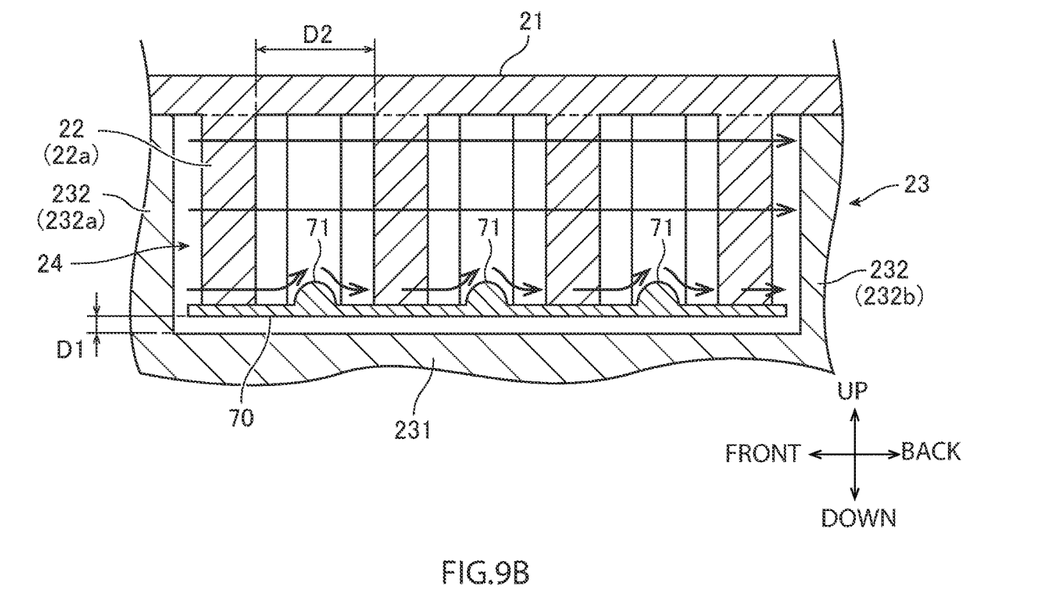
Figure 10:
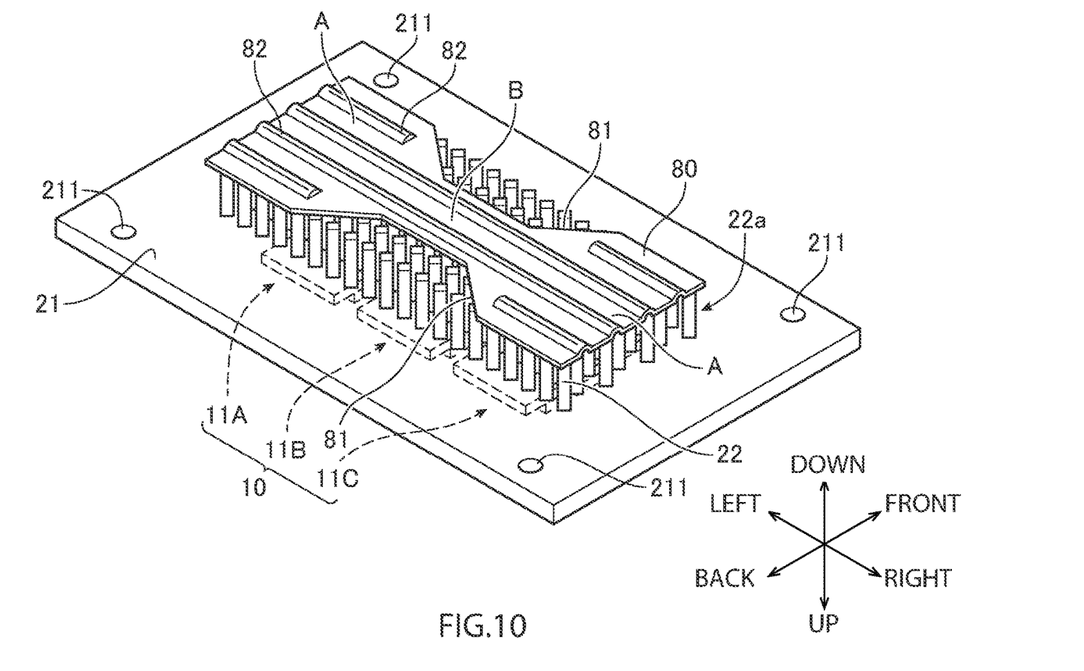
FIG. 10 is a perspective view of a reinforcing plate according to a sixth modification.

Next, modifications will be described with reference to FIGS. 5 to 10. FIG. 5 is a perspective view of the cooling base (FIG. 5A) and a cross section illustrating the flow of the cooling medium (FIG. 5B) according to a first modification. FIG. 6 is a perspective view of the reinforcing plate (FIG. 6A) and a cross section illustrating the flow of the cooling medium (FIG. 6B) according to a second modification. FIG. 7 is a perspective view (FIG. 7A) and a cross section (FIG. 7B) of the reinforcing plate according to a third modification. FIG. 8 is a plan view of the reinforcing plate according to a fourth modification. FIG. 9 is a plan view of the reinforcing plate (FIG. 9A) and a cross section illustrating the flow of the cooling medium (FIG. 9B) according to a fifth modification. FIG. 10 is a perspective view of a reinforcing plate according to a sixth modification. Note that in the modifications illustrated hereinafter, portions of the configuration shared in common with the embodiment will be denoted with the same signs wherever possible, and the description will be omitted where appropriate.

As illustrated in FIG. 5, the heat dissipating substrate 21 according to the first modification includes a recessed part 21a (second recessed part) that is recessed in the thickness direction in correspondence with the region where the plurality of fins 22 are provided on the heat dissipating surface. More specifically, the recessed part 21a is recessed toward the front side in the heat dissipation region on the back side of the heat dissipating substrate 21 where the circuit element units 11A, 11B, and 11C are disposed. Because of the recessed part 21a, the board thickness is reduced in the heat dissipation region of the heat dissipating substrate 21. The plurality of fins 22 project downward from the floor of the recessed part 21a. The reinforcing plate 30 is bonded to the tips of the plurality of fins 22 to cover the entire bottom surface of the group 22a.

According to the first modification, by bonding the reinforcing plate 30 to the fins 22, the rigidity of the entire heat dissipating substrate 21 including the fins 22 and the reinforcing plate 30 is increased. Consequently, the overall rigidity is ensured even though the recessed part 21a is formed in a portion of the heat dissipating substrate 21. By forming the recessed part 21a in the heat dissipation region, the board thickness of the heat dissipating substrate 21 directly underneath the circuit element units 11A, 11B, and 11C is thinner, making it possible to lower the thermal resistance. As a result, the conductivity of heat generated in the circuit element units 11A, 11B, and 11C can be raised, and heat dissipation is improved.

Also, as illustrated in FIG. 5B, because the recessed part 21a is formed in correspondence with the region where the plurality of fins 22 are provided, a flow along the surface of the recessed part 21a is produced when the coolant flows in among the plurality of fins 22. With this arrangement, the flow of the coolant among the fins 22 is disturbed in the height direction of the fins 22 (vertical direction). By producing such a turbulent flow of coolant, more collisions occur between the coolant and the surface of the fins 22, thereby promoting heat exchange between the coolant and the fins 22. Consequently, it is possible to raise the cooling efficiency further.

Also, FIG. 5 is referenced to describe a case where the recessed part 21a having a rectangular shape in a plan view is formed at a uniform depth throughout the heat dissipation region, but the recessed part 21a is not limited to the above configuration. The recessed part 21a may also be formed partially divided into sections according to the spots where it is desirable to raise the cooling efficiency, and the recessed part 21a may also be formed such that the depth changes gradually.

As illustrated in FIG. 6, in a reinforcing plate 40 according to the second modification, bent parts (a first bent part 41 and a second bent part 42) for guiding the flow of the coolant are formed on the pair of edges opposite to each other in the transverse direction. Specifically, the edges on the transverse sides of the reinforcing plate 40 are provided with a first bent part 41 bent in the direction (downward) away from the tips of the fins 22 and a second bent part 42 bent in the direction (upward) toward the base end of the fins 22.

As illustrated in FIGS. 6A and 6B, on the edge on one transverse side (the upstream side in the direction of coolant flow) of the reinforcing plate 40, the first bent part 41 and the second bent part 42 are formed in an alternating arrangement in the longitudinal direction. In FIG. 6A, a pair of the first bent parts 41 are disposed on the left and right ends, and the second bent part 42 is disposed between the pair of first bent parts 41. In contrast, on the edge on the other transverse side (the downstream side in the direction of coolant flow) of the reinforcing plate 40, the first bent part 41 is formed along the entire length. The first bent parts 41 and the second bent parts 42 may also be provided by being divided in correspondence with the circuit element units 11A, 11B, and 11C (not illustrated in FIG. 6) disposed on the heat dissipating substrate 21.

Because of the first bent part 41 bent downward (toward the floor of the recessed part 24), the gap D1 between the reinforcing plate 40 and the floor of the recessed part 24 is closed. Consequently, the coolant flows less readily through the gap D1, but flows more easily in the gap D2 between the plurality of fins 22. Also, because of the second bent part 42 bent upward (away from the floor of the recessed part 24), it is possible to guide the coolant from above the recessed part 24 to the gap D2 between the plurality of fins 22. In this way, it is possible to use the bent parts to adjust the coolant channel and improve the cooling efficiency. Also, by adjusting the shape of the bent parts to face upward or downward according to the disposed location of each circuit element unit acting as a heat-generating part, it is possible to control the flow rate distribution of the coolant for each circuit element unit and achieve uniform temperature management. Additionally, the bend angle of the bent parts is not limited to a right angle, and may also be an outwardly oblique angle for example.

As illustrated in FIG. 7, a reinforcing plate 50 according to the third modification includes a plurality of beam parts 51 formed on the surface opposite from the surface to which the plurality of fins 22 are bonded. Specifically, the beam parts 51 are provided on the surface of the reinforcing plate 50 that faces the floor of the recessed part 24. The beam parts 51 project downward (toward the floor of the recessed part 24) from the surface of the reinforcing plate 50 and extend in the longitudinal direction (horizontal direction) of the reinforcing plate 50. Also, a plurality of (in FIG. 7, four) beam parts 51 are provided in the transverse direction of the reinforcing plate 50. For example, the beam parts 51 are formed by stamping a raised part from the top side (the bonding surface side with respect to the fins 22) to the bottom side of the reinforcing plate 50. Note that properties such as the shape, number, and length of the beam parts 51 may be modified appropriately. According to the beam parts 51, the rigidity of the reinforcing plate 50 is increased, making it possible to reduce warping of the reinforcing plate 50.

As illustrated in FIG. 8, a reinforcing plate 60 according to the fourth modification includes positioning parts 61 configured to engage with at least a portion of the plurality of fins 22 on the surface (bonding surface) to which the plurality of fins 22 are bonded. Specifically, the positioning parts 61 are respectively provided at the four corners of the rectangular reinforcing plate 60. The positioning parts 61 are formed as dome-shaped protrusions, for example, and are preferably formed having a size corresponding to the gap between adjacent fins 22. This configuration makes it easy to position the reinforcing plate 60 with respect to the plurality of fins 22, and the number of assembly steps can be decreased.

As illustrated in FIG. 9, a reinforcing plate 70 according to the fifth modification includes a plurality of projections 71 on the surface (bonding surface) to which the plurality of fins 22 are bonded. The plurality of projections 71 are provided at positions that do not overlap with the plurality of fins 22 in a plan view. For example, the plurality of projections 71 are disposed at the same pitch as the plurality of fins 22. The projections 71 are formed as dome-shaped protrusions, for example, and are preferably formed slightly smaller than the gap between adjacent fins 22. According to this configuration, by providing a countless number of projections 71 in the coolant channel formed among the plurality of fins 22, the flow of the coolant is disturbed in the height direction of the fins 22 (vertical direction) when the coolant flows near the projections 71 among the fins 22. By producing such a turbulent flow of coolant, more collisions occur between the coolant and the surface of the fins 22, thereby promoting heat exchange between the coolant and the fins 22. Consequently, it is possible to raise the cooling efficiency further.

Each embodiment above describes a case where reinforcing plate is formed having a rectangular shape in a plan view, but the reinforcing plate is not limited to this configuration. For example, the configuration illustrated in FIG. 10 is also possible. As illustrated in FIG. 10, in a reinforcing plate 80 according to the sixth modification, trapezoidal notches 81 are formed such that the front-back width of the central portion in the longitudinal direction is narrowed compared to the ends. In other words, the tips of the fins 22 are in an exposed state only in the portions of the notches 81. Also, a plurality of beam parts 82 extending in the longitudinal direction are formed on the bottom surface (the surface on the opposite side of the bonding surface) of the reinforcing plate 80. The beam parts 82 project out in the opposite side of the fins 22. In this way, to the extent that the rigidity of the reinforcing plate 80 itself is lowered due to the notches 81, the rigidity of the reinforcing plate 80 overall is ensured by the beam parts 82. Also, because some of the fins 22 positioned centrally in the longitudinal direction are open due to the notches 81, it is possible to adjust the flow rate distribution of the coolant between the longitudinal ends and the central portion of the reinforcing plate 80. In this way, by changing the shape of the reinforcing plate 80 with respect to the group 22a of fins 22, it is possible to control the cooling performance appropriately. The reinforcing plate 80 includes a wide portion of large area (portion A) and a narrow portion of small area (portion B). By disposing the reinforcing plate 80 such that the portion A faces the portions where the heat dissipating substrate 21 may undergo relatively large deformation and the portion B faces the portion where the heat dissipating substrate 21 may undergo relatively small deformation, deformation in the heat dissipating substrate 21 overall can be balanced out.

In addition, the present embodiment and modifications have been described, but the above embodiment and the modifications may also be combined in full or in part and treated as another embodiment. For example, the features of the each of the modifications from FIGS. 5 to 10 may be combined. Specifically, the recessed part 21a in FIG. 5 and the bent parts in FIG. 6 may be combined, or the positioning parts 61 in FIG. 8 and the projections 71 in FIG. 9 may be combined.

As an example of a combination, the heat dissipating substrate 21, the plurality of insulating substrates 14, the plurality of semiconductor elements 12, the plurality of fins 22, and the reinforcing plate 30 may be provided as an assembly.

In the assembly, the heat dissipating substrate 21 may include a bonding surface and a heat dissipating surface on the opposite side of the bonding surface, and may be rectangular in a plan view. Each of the plurality of insulating substrates 14 may include a first surface and a second surface on the opposite side of the first surface, and may be disposed in the longitudinal direction of the heat dissipating substrate 21. The second surface of each of the plurality of insulating substrates 14 may be bonded to the bonding surface of the heat dissipating substrate 21. Each of the semiconductor elements 12 may be mounted on the first surface of the plurality of insulating substrates 14. The plurality of fins 22 are disposed underneath the plurality of insulating substrates 14, and are provided on the heat dissipating surface of the heat dissipating substrate 21. The reinforcing plate 30 may be disposed to face at least a portion of the plurality of fins 22, and may be bonded to the tips of the plurality of fins 22. The reinforcing plate 30 here may be as thick as, thicker, or thinner than the heat dissipating substrate 21.

Furthermore, the reinforcing plate 30 may be rectangular in a plan view, may be disposed to face the tips of the entire plurality of fins 22, and may be bonded to the tips of the plurality of fins 22. The heat dissipating substrate 21 and the reinforcing plate 30 may each be a plate containing aluminum or an aluminum alloy. Each of the insulating substrates 14 may include a ceramic board containing aluminum oxide, silicon nitride, or aluminum nitride.

In the above assembly, the heat dissipating substrate 21 may have a shape that protrudes from the reinforcing plate 30 toward the insulating substrates 14, or may be flat.

The assembly is fitted to the cooling case 23 including the recessed part 24 capable of housing the plurality of fins 22 and the reinforcing plate 30 (see FIG. 2). The assembly may be used by being affixed to the side walls 232 of the cooling case 23 with a sealing member. Here, the length of the plurality of fins 22 and the thickness of the reinforcing plate 30 may be selected such that the gap between the plurality of fins 22 is larger than the gap between the reinforcing plate 30 and the floor of the recessed part 24. Furthermore, the assembly and the cooling case 23 may be configured to have a first header 233b provided on one side (the front side in FIG. 2B) of the plurality of fins 22 and a second header 234b provided on the other opposite side (the back side) of the plurality of fins 22. The coolant introduced from the inlet port 233 spreads out longitudinally in the first header 233b, flows into the front and is discharged out from the back of the plurality of fins 22, and after being constricted in the second header 234b, is discharged from the outlet port 234.

Note that the present invention is not limited to the embodiments described above, and various modifications are possible. In the embodiments described above, properties such as the sizes, shapes, and functions of the components illustrated in the accompanying drawings are not limited to what is illustrated, and such properties may be modified appropriately insofar as the effects of the present invention are still achieved. Otherwise, other appropriate modifications are possible without departing from the scope of the present invention.

Features of the above embodiments are summarized below.

A semiconductor device according to the above embodiment is a semiconductor device including an insulating substrate including a first surface and a second surface on an opposite side of the first surface, semiconductor elements mounted on the first surface of the insulating substrate, and a cooler for cooling the semiconductor elements, the cooler including: a heat dissipating substrate including a bonding surface and a heat dissipating surface on an opposite side of the bonding surface, the bonding surface being bonded to the second surface of the insulating substrate; a plurality of fins provided on the heat dissipating surface of the heat dissipating substrate; a reinforcing plate disposed to cover the plurality of fins and bonded to tips of the plurality of fins; and a cooling case including a recessed part that houses the plurality of fins and the reinforcing plate, wherein a gap between the plurality of fins is larger than a gap between the reinforcing plate and a floor of the recessed part.

In the semiconductor device according to the above embodiment, the insulating substrate on which the semiconductor elements are mounted is provided plurally, and the plurality of insulating substrates are arranged in a predetermined direction, the plurality of fins are provided in a heat dissipation region corresponding to the heat dissipating surface of the heat dissipating substrate on which the plurality of insulating substrates are provided, the cooling case includes side walls that surround the plurality of fins, the side walls include a first side wall and a second side wall that oppose each other in a direction intersecting the predetermined direction in which the plurality of insulating substrates are arranged, an inlet port for a coolant is provided in the first side wall, and an outlet port for the coolant is provided in the second side wall, and the coolant flows in the direction intersecting the predetermined direction from the inlet port, among the plurality of fins, and toward the outlet port.

In the semiconductor device according to the above embodiment, the heat dissipating substrate includes a second recessed part that is recessed in a thickness direction in correspondence with a region where the plurality of fins are provided on the heat dissipating surface.

In the semiconductor device according to the above embodiment, the reinforcing plate includes a first bent part that is bent toward the floor of the first recessed part on an upstream and/or downstream edge in the direction of coolant flow.

In the semiconductor device according to the above embodiment, the reinforcing plate includes a second bent part that is bent away from the floor of the first recessed part on an upstream and/or downstream edge in the direction of coolant flow.

In the semiconductor device according to the above embodiment, the reinforcing plate includes a beam part formed on the surface opposite from the surface to which the plurality of fins are bonded.

In the semiconductor device according to the above embodiment, the reinforcing plate includes a positioning part configured to engage with at least a portion of the plurality of fins on the surface to which the plurality of fins are bonded.

In the semiconductor device according to the above embodiment, the reinforcing plate includes a plurality of projections on the surface to which the plurality of fins are bonded, and the plurality of projections are provided at positions that do not overlap with the plurality of fins in a plan view.

INDUSTRIAL APPLICABILITY

The semiconductor device according to the present invention has an effect of ensuring cooling performance while also ensuring rigidity, and is suited to a semiconductor device demanded to have a compact size and high output, such as a driving control inverter for a motor mounted on a vehicle.

This application is based on Japanese Patent Application No. 2019-229215 filed on Dec. 19, 2019, the content of which is hereby incorporated in entirety.

What is claimed is:

1. A semiconductor device, comprising
an insulating substrate including a first surface and a second surface opposite to each other;
semiconductor elements mounted on the first surface of the insulating substrate; and
a cooler for cooling the semiconductor elements, the cooler including:
  a heat dissipating substrate including a bonding surface and a heat dissipating surface opposite to each other, the bonding surface being bonded to the second surface of the insulating substrate;
  a plurality of fins provided on the heat dissipating surface of the heat dissipating substrate;
  a reinforcing plate having a first surface and a second surface opposite to each other and covering the plurality of fins, the first surface of the reinforcing plate being bonded to tips of the plurality of fins; and
  a cooling case having a first recessed part to house therein the plurality of fins and the reinforcing plate, wherein
a first gap between two of the plurality of fins that are adjacent to each other, measured in a direction parallel to the heat dissipating substrate, is larger than a second gap between the reinforcing plate and a bottom of the first recessed part, measured in a thickness direction orthogonal to the heat dissipating surface of the heat dissipating substrate, and
the reinforcing plate includes a plurality of projections on the first surface thereof to which the plurality of fins are bonded, and that do not overlap positions of the plurality of fins in a plan view of the semiconductor device.

2. The semiconductor device according to claim 1, wherein
the insulating substrate on which the semiconductor elements are mounted is provided plurally, and the plurality of insulating substrates are arranged in a first direction,
the plurality of fins are provided in a heat dissipation region that corresponds to, in a plan view of the semiconductor device, an area of the heat dissipating surface of the heat dissipating substrate on which the plurality of insulating substrates are provided,
the cooling case includes side walls that surround the plurality of fins,
the side walls include a first side wall and a second side wall opposite to each other in a second direction intersecting the first direction,
the first side wall has an inlet port for a coolant, and the second side wall has an outlet port for the coolant, and
the coolant flows among the plurality of fins in the second direction from the inlet port toward the outlet port.

3. The semiconductor device according to claim 1, wherein
the heat dissipating substrate includes a second recessed part that is recessed from the heat dissipating surface toward the bonding surface in the thickness direction at an area corresponding to an area where the plurality of fins are provided.

4. The semiconductor device according to claim 1, wherein the reinforcing plate includes a beam part formed on the second surface thereof opposite to the first surface thereof to which the plurality of fins are bonded.

5. A semiconductor device, comprising:
an insulating substrate including a first surface and a second surface opposite to each other;
semiconductor elements mounted on the first surface of the insulating substrate; and
a cooler for cooling the semiconductor elements, the cooler including:
  a heat dissipating substrate including a bonding surface and a heat dissipating surface opposite to each other, the bonding surface being bonded to the second surface of the insulating substrate;

a plurality of fins provided on the heat dissipating surface of the heat dissipating substrate;

a reinforcing plate having a first surface and a second surface opposite to each other and covering the plurality of fins, the first surface of the reinforcing plate being bonded to tips of the plurality of fins; and a cooling case having a first recessed part to house therein the plurality of fins and the reinforcing plate, wherein a first gap between two of the plurality of fins that are adjacent to each other, measured in a direction parallel to the heat dissipating substrate, is larger than a second gap between the reinforcing plate and a bottom of the first recessed part, measured in a thickness direction orthogonal to the heat dissipating surface of the heat dissipating substrate, the insulating substrate on which the semiconductor elements are mounted is provided plurally, and the plurality of insulating substrates are arranged in a first direction, the plurality of fins are provided in a heat dissipation region that corresponds to, in a plan view of the semiconductor device, an area of the heat dissipating surface of the heat dissipating substrate on which the plurality of insulating substrates are provided, the cooling case includes side walls that surround the plurality of fins, the side walls include a first side wall and a second side wall opposite to each other in a second direction intersecting the first direction, the first side wall has an inlet port for a coolant, and the second side wall has an outlet port for the coolant, the coolant flows among the plurality of fins in the second direction from the inlet port toward the outlet port, and the reinforcing plate includes a first bent part that is bent toward the bottom of the first recessed part on an upstream and/or downstream edge thereof in the second direction.

6. A semiconductor device, comprising:

an insulating substrate including a first surface and a second surface opposite to each other;

semiconductor elements mounted on the first surface of the insulating substrate; and a cooler for cooling the semiconductor elements, the cooler including:

a heat dissipating substrate including a bonding surface and a heat dissipating surface opposite to each other, the bonding surface being bonded to the second surface of the insulating substrate;

a plurality of fins provided on the heat dissipating surface of the heat dissipating substrate;

a reinforcing plate having a first surface and a second surface opposite to each other and covering the plurality of fins, the first surface of the reinforcing plate being bonded to tips of the plurality of fins; and a cooling case having a first recessed part to house therein the plurality of fins and the reinforcing plate, wherein a first gap between two of the plurality of fins that are adjacent to each other, measured in a direction parallel to the heat dissipating substrate, is larger than a second gap between the reinforcing plate and a bottom of the first recessed part, measured in a thickness direction orthogonal to the heat dissipating surface of the heat dissipating substrate, the insulating substrate on which the semiconductor elements are mounted is provided plurally, and the plurality of insulating substrates are arranged in a first direction, the plurality of fins are provided in a heat dissipation region that corresponds to, in a plan view of the semiconductor device, an area of the heat dissipating surface of the heat dissipating substrate on which the plurality of insulating substrates are provided, the cooling case includes side walls that surround the plurality of fins, the side walls include a first side wall and a second side wall opposite to each other in a second direction intersecting the first direction, the first side wall has an inlet port for a coolant, and the second side wall has an outlet port for the coolant, the coolant flows among the plurality of fins in the second direction from the inlet port toward the outlet port, and the reinforcing plate includes a second bent part that is bent away from the bottom of the first recessed part on an upstream and/or downstream edge in the second direction.

7. A semiconductor device, comprising:

an insulating substrate including a first surface and a second surface opposite to each other;

semiconductor elements mounted on the first surface of the insulating substrate; and a cooler for cooling the semiconductor elements, the cooler including:

a heat dissipating substrate including a bonding surface and a heat dissipating surface opposite to each other, the bonding surface being bonded to the second surface of the insulating substrate;

a plurality of fins provided on the heat dissipating surface of the heat dissipating substrate;

a reinforcing plate having a first surface and a second surface opposite to each other and covering the plurality of fins, the first surface of the reinforcing plate being bonded to tips of the plurality of fins; and a cooling case having a first recessed part to house therein the plurality of fins and the reinforcing plate, wherein a first gap between two of the plurality of fins that are adjacent to each other, measured in a direction parallel to the heat dissipating substrate, is larger than a second gap between the reinforcing plate and a bottom of the first recessed part, measured in a thickness direction orthogonal to the heat dissipating surface of the heat dissipating substrate, and the reinforcing plate includes a positioning part protruding from the first surface of the reinforcing plate toward the heat dissipation surface of the heat dissipating substrate to engage with at least one of the plurality of fins.

* * * * *